(12) United States Patent
Okamura et al.

(10) Patent No.: US 8,071,415 B2
(45) Date of Patent: Dec. 6, 2011

(54) METHOD OF FABRICATING SEMICONDUCTOR DEVICE

(75) Inventors: Tomohiro Okamura, Miyagi (JP); Masao Okihara, Miyagi (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 12/659,601

(22) Filed: Mar. 15, 2010

(65) Prior Publication Data

US 2010/0248410 A1    Sep. 30, 2010

(30) Foreign Application Priority Data

Mar. 27, 2009   (JP) ................................. 2009-080534

(51) Int. Cl.
*H01L 21/00* (2006.01)
(52) U.S. Cl. .................................. 438/59; 257/E31.097
(58) Field of Classification Search ...................... 438/59
See application file for complete search history.

(56) References Cited

U.S. PATENT DOCUMENTS

| 6,642,561 B2 * | 11/2003 | Kakumoto et al. | 257/292 |
| 2008/0108166 A1 * | 5/2008 | Park et al. | 438/59 |
| 2010/0032569 A1 * | 2/2010 | Kita | 250/338.4 |

FOREIGN PATENT DOCUMENTS

| JP | 2006-024787 A | 1/2006 |
| JP | 2006-245246 A | 9/2006 |

* cited by examiner

*Primary Examiner* — Charles Garber
*Assistant Examiner* — Reema Patel
(74) *Attorney, Agent, or Firm* — Rabin & Berdo, PC

(57) ABSTRACT

There is provided a method of fabricating a semiconductor device having plural light receiving elements, and having an amplifying element, the method including: a) forming an active region on the semiconductor substrate for configuring the amplifying element; b) forming a light receiving element region on the semiconductor substrate for forming the plural light receiving elements, with the active region acting as a reference for positioning; c) implanting an impurity into the light receiving element region; d) repeating the process b) and the process c) a number of times that equals a number of diffusion layers in the light receiving element region; e) after implanting the impurity, performing a drive-in process to carry out drive in of the semiconductor substrate; and f) the process e), forming an amplifying element forming process by implanting an impurity in the active region.

3 Claims, 7 Drawing Sheets

METHOD OF FABRICATING SEMICONDUCTOR DEVICE

CROSS-REFERENCE TO RELATED APPLICATION

This application is based on and claims priority under 35 USC 119 from Japanese Patent Application No. 2009-080534 filed on Mar. 27, 2009, the disclosure of which is incorporated by reference herein.

BACKGROUND

1. Technical Field

The present invention relates to a method of fabricating a semiconductor device provided with two or more types of light receiving element.

2. Related Art

Conventionally, semiconductor devices provided with light receiving elements, for example illumination sensors, image sensors, or the like, are configured, for example, with two or more types of photodiode (light receiving element) formed in a silicon substrate.

For example, for an SOI substrate having a semiconductor layer formed on a semiconductor substrate with an insulating layer interposed therebetween, a method is disclosed in Japanese Patent Application Laid-Open (JP-A) No. 2006-24787 of removing the insulating layer and the semiconductor layer to expose a portion of the semiconductor substrate, forming a well in the exposed semiconductor substrate for forming a photodiode, and then forming a transistor in the semiconductor layer.

Also, in JP-A No. 2006-245246, there is a proposal to configure two or more types of photodiode such that they each have a different junction depth. In this proposal, sensitivity is imparted to light of comparatively shorter wavelengths as the junction depth gets shallower, and sensitivity is imparted to light of shorter comparative wavelengths when the junction is formed deeper. By detecting the photoelectric current from such photodiodes having sensitivity to different wavelengths, and by computation with a computation circuit, a photodiode is formed that suppresses sensitivity to the infrared wavelength region.

However, an extremely complicated structure arises when two or more types of photodiode (light receiving element) are formed in a silicon substrate, and there is a greater number of fabrication processes.

SUMMARY

The present invention addresses the issue of providing a method of fabricating a semiconductor device to obtain a semiconductor device provided with two or more types or light receiving element, with a reduced number of processes and lower cost.

An aspect of the present invention provides a method of fabricating a semiconductor device having a plurality of light receiving elements, and having an amplifying element that amplifies an output signal from the light receiving elements, mounted on a semiconductor substrate, the method including:

a) an active region forming process that forms an active region on the semiconductor substrate for configuring the amplifying element;

b) after the active region forming process, performing a light receiving element region forming process that forms a light receiving element region on the semiconductor substrate for forming the plurality of light receiving elements, with the active region acting as a reference for positioning;

c) after the light receiving element region forming process, performing an impurity implantation process that implants an impurity into the light receiving element region;

d) repeating the light receiving element region forming process b) and repeating the impurity implantation process c) a number of times that equals a number of diffusion layers in the light receiving element region;

e) after the impurity implantation process, performing a drive-in process to carry out drive in of the semiconductor substrate; and f) after the drive-in process, performing an amplifying element forming process that implants an impurity in the active region and forms the amplifying element.

According to the present invention, a method of fabricating a semiconductor device can be provided that obtains a semiconductor provided with two or more types or light receiving element, with a reduced number of processes and lower cost.

BRIEF DESCRIPTION OF THE DRAWINGS

Exemplary embodiments of the present invention will be described in detail based on the following figures, wherein.

DETAILED DESCRIPTION

Figure 1:
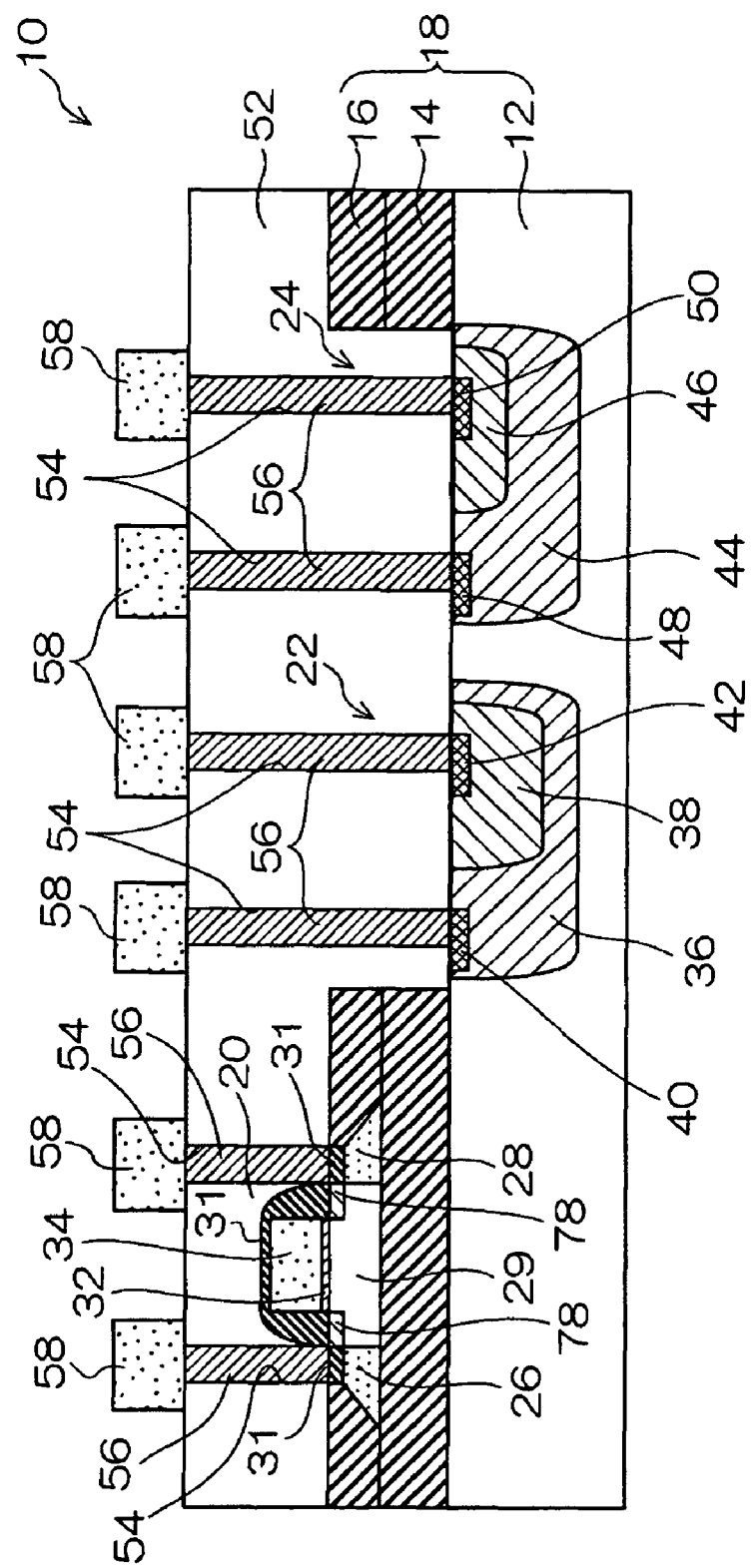
FIG. 1 is a schematic diagram showing a semiconductor device obtained by the semiconductor device fabrication method according to the present exemplary embodiment.

Explanation follows of an exemplary embodiment of the present invention, with reference to the drawings. Components having essentially the same function are allocated the same reference numeral throughout the drawings, and sometimes repeated explanation thereof is omitted.

FIG. 1 is a schematic diagram showing a semiconductor device obtained by a semiconductor device fabrication method according to the present exemplary embodiment. FIG. 2A to FIG. 2M are process diagrams showing a semiconductor device fabrication method according to the present exemplary embodiment.

Configuration of Semiconductor Device

A brief explanation is first given regarding the configuration of a semiconductor device 10 (referred to below as the semiconductor device according to the present exemplary embodiment) obtained by the semiconductor device fabrication method according to the present exemplary embodiment.

The semiconductor device 10 according to the present exemplary embodiment is an example of an illumination sensor, and employs a semiconductor substrate 18 of SOI structure formed with a silicon layer 16 formed, from a thin single crystal of silicon, on a silicon support substrate 12 made from silicon (Si), with an embedded oxide film layer 14 formed as an insulating layer from silicon dioxide ($SiO_2$) interposed between the semiconductor substrate 18 and the silicon support substrate 12. A control circuit transistor (amplifying element) 20 is formed to the silicon layer 16 of the semiconductor substrate 18, and photodiodes (light receiving elements) 22 and 24 are also formed.

The control circuit transistor 20 is of a known configuration, and, for example, is configured including a source region 26 and a drain region 28, a channel region 29 interposed therebetween, and with a gate oxide film 32 and a gate electrode 34 formed on the channel region in this sequence. A silicide layer 31 is formed on the top faces of the gate electrode 34, the surface of the source region 26 and the surface of the drain region 28.

The structure of the photodiode 22 is configured including an N type well 36 provided to the silicon support substrate 12, and a P type well 38 provided within the N type well 36. The interface of the N type well 36 and the P type well 38 is a PN junction. An N+ type impurity diffusion layer 40 of high concentration is formed to the N type well 36 of the photodiode 22, for employing as an extraction electrode, and a P+ type impurity diffusion layer 42 of high concentration is formed to the P type well 38, for employing as an extraction electrode.

The structure of the photodiode 24 is configured including an N type well 44 provided to the silicon support substrate 12, and a P type well 46 provided within the N type well 44. The interface of the N type well 44 and the P type well 46 is a PN junction. An N+ type impurity diffusion layer 48 of high concentration is formed to the N type well 44 of the photodiode 24, for employing as an extraction electrode, and a P+ type impurity diffusion layer 50 of high concentration is formed to the P type well 46, for employing as an extraction electrode.

The PN junction in the photodiode 24 is positioned shallower than the PN junction of the photodiode 22. In this manner, the photodiode 24, by being formed with a PN junction positioned shallower than the PN junction of the photodiode 22, is imparted with a sensitivity to, for example, a wavelength region of about 300 nm to about 500 nm. However, by the photodiode 22 having a PN junction positioned deeper than that of the photodiode 24, the sensitivity can be deadened to the wavelength region of about 300 nm to about 500 nm. Sensitivity to the visible wavelength region can be imparted by application of such two types of photodiode, by detecting the photoelectric current from these two types of photodiode, and by use of a computation circuit.

Furthermore, an interlayer insulation film 52 is formed over the entire surface of the silicon layer 16 and the P type silicon support substrate 12. Contact holes 54, which communicate with the silicide layer 31 of the control circuit transistor 20, the N+ type impurity diffusion layer 40 and the P+ type impurity diffusion layer 42 of the photodiode 22, the N+ type impurity diffusion layer 48 and the P+ type impurity diffusion layer 50 of the photodiode 24, are filled in with a conductive contact plugs 56. Wiring lines 58 are formed on the top face of the interlayer insulation film 52, electrically connected to each of the conductive contact plugs 56.

Method of Fabricating Semiconductor Device

Explanation follows of a method of fabricating the semiconductor device 10 according to the present exemplary embodiment, with reference to FIG. 2A to FIG. 2M.

Figure 2A:
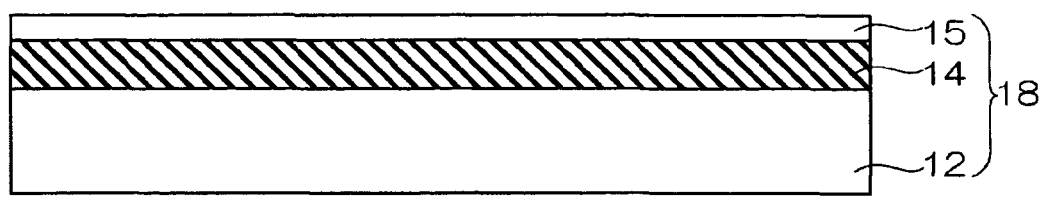
FIG. 2A to FIG. 2M are process diagrams showing a semiconductor device fabrication method according to the present exemplary embodiment.

First, as shown in FIG. 2A, a Silicon On Insulator (SOI) substrate (SOI wafer) is prepared as the P type semiconductor substrate 18 formed with, for example, the silicon support substrate 12, the embedded oxide film layer 14, and a silicon layer 15, in this sequence.

Figure 2B:
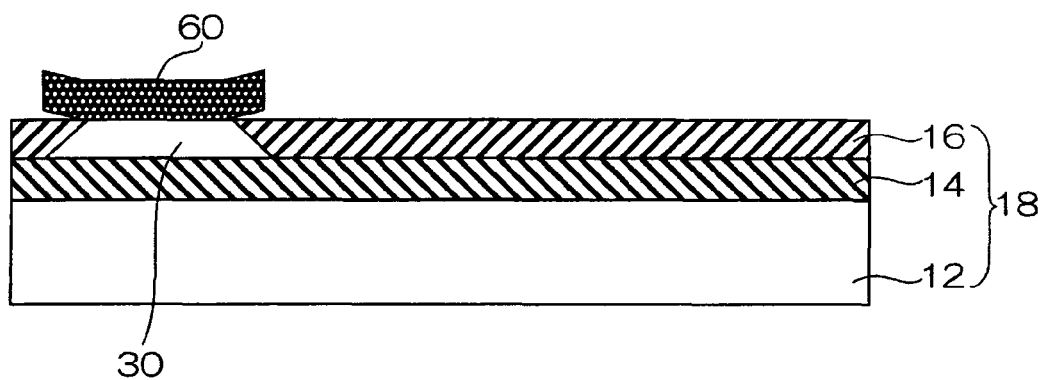

Next, as shown in FIG. 2B, a patterned nitride film layer 60 is formed on the silicon layer 15, the nitride film layer 60 becoming an active region 30 for forming the control circuit transistor 20 (see FIG. 1). Using the nitride film layer 60 as a mask, an isolation layer (silicon layer 16) is formed using a Local Oxidation Of Silicon (LOCOS) method, or a Shallow Trench Isolation (STI) method, to oxidize the silicon layer 15 as far as the embedded oxide film layer 14. The layer region below the mask of the nitride film layer 60 becomes the active region 30 for forming the control circuit transistor 20 (active region forming process).

Figure 2C:
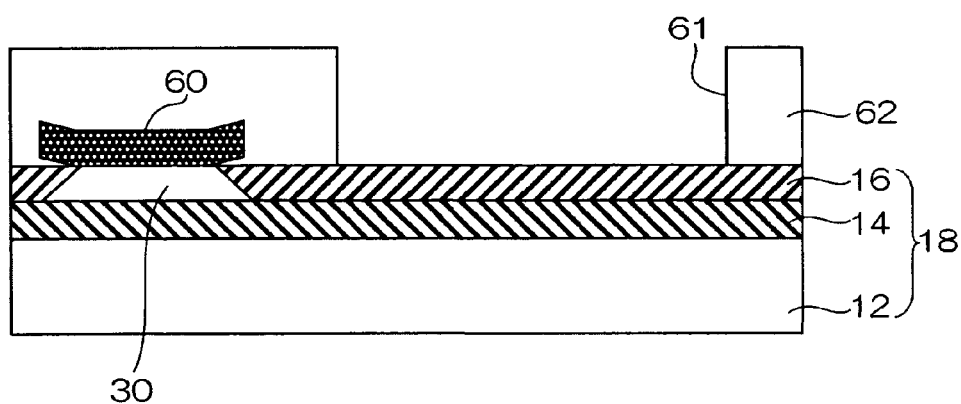

Next, as shown in FIG. 2C, a photoresist 62 is formed, with the active region 30 acting as a reference for positioning, on the semiconductor substrate 18 with an opening pattern 61 formed for exposing the regions that become the photodiodes 22 and 24.

Figure 2D:
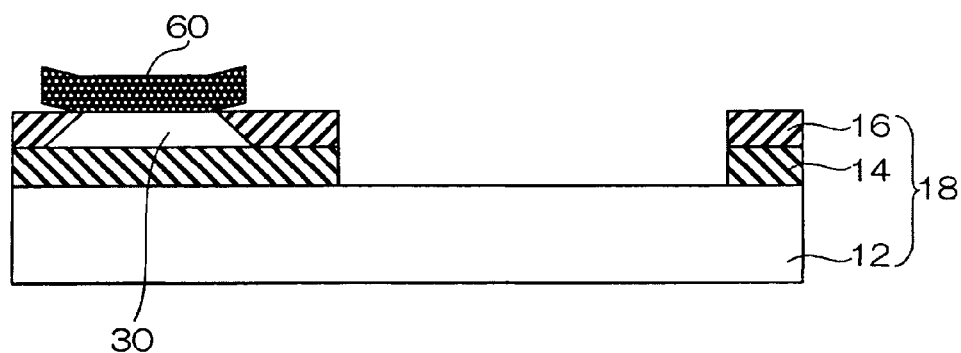

Then, with the photoresist 62 as a mask, the silicon layer 16 and the embedded oxide film layer 14 are removed in the region opened by the opening pattern 61 using dry etching, such as, for example, Reactive Ion Etching (RIE) or the like, as shown in FIG. 2D. A portion of the surface of the silicon support substrate 12 of the semiconductor substrate 18 is thereby exposed. After dry etching, an oxide film (not shown in the figures) of about 30 nm is formed. This functions as a protective film, such as during implantation processes, nitride film removal, and the like.

Figure 2E:
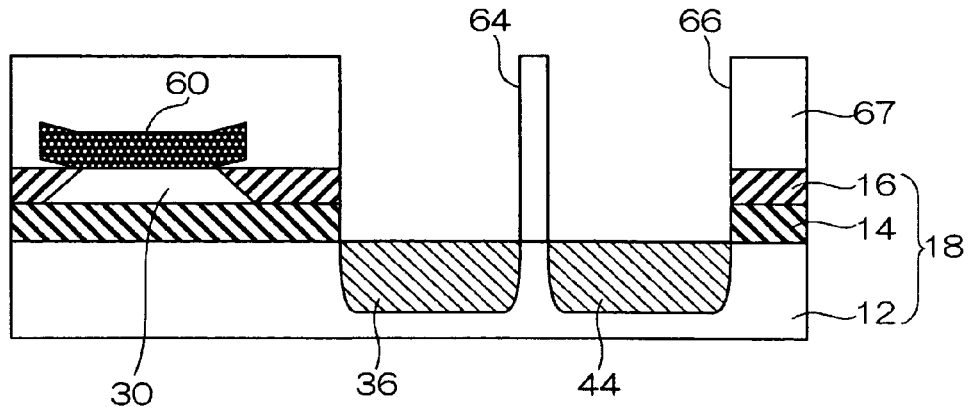

Next, as shown in FIG. 2E, a photoresist 67 is formed on the semiconductor substrate 18, with the active region 30 acting as a reference for positioning, with opening patterns 64 and 66 formed to expose the regions of the photodiodes 22 and 24, respectively (light receiving element region forming process).

With the photoresist 67 acting as a mask, the N type well 36 that configures the photodiode 22, and the N type well 44 that configures the photodiode 24, are both formed at the same time in the surface layer of the silicon support substrate 12 of the semiconductor substrate 18 by ion implantation (impurity implantation process). This ion implantation is, for example, performed employing phosphorous as the ion species, with ions implanted by acceleration to about 2400 KeV (so-called N-well implantation).

Figure 2F:
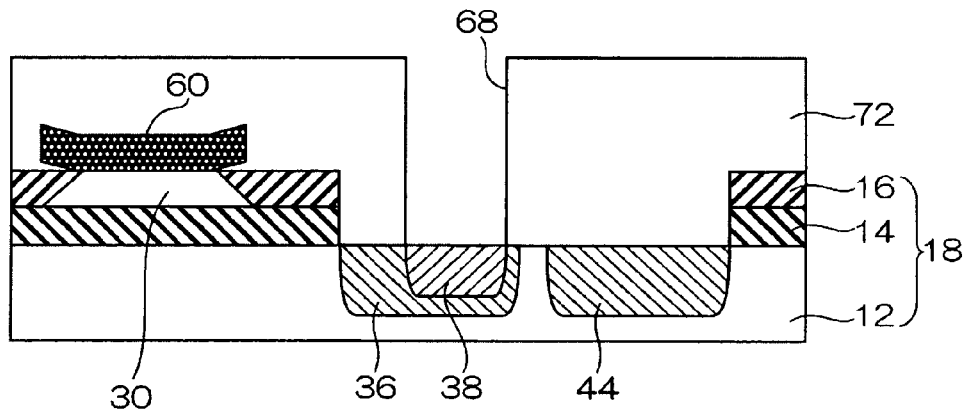

Then, after the photoresist 67 has been removed, a photoresist 72 is formed on the semiconductor substrate 18, with the active region 30 acting as a reference for positioning, with an opening pattern 68 formed for exposing a central portion of the N type well 36 that configures the photodiode 22, as shown in FIG. 2F (light receiving element region forming process).

Using the photoresist 72 as a mask, the P type well 38 is formed in the surface layer of a central portion of the N type well 36 that configures the photodiode 22 using ion implantation (impurity implantation process). The ion implantation is, for example, performed employing boron as the ion species, with the ions implanted by acceleration to about 1000 KeV (so-called P-well implantation).

Figure 2G:
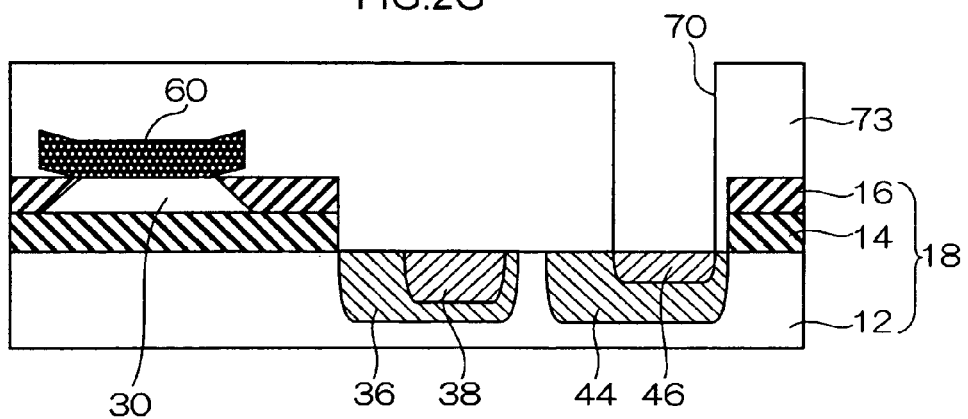

Then, after the photoresist 72 has been removed, a photoresist 73 is formed on the semiconductor substrate 18, with the active region 30 acting as a reference for positioning, with an opening pattern 70 formed to expose a central portion of the N type well 44 that configures the photodiode 24, as shown in FIG. 2G (light receiving element region forming process).

Using the photoresist 73 as a mask, the P type well 46 is formed in the surface layer of a central portion of the N type well 44 that configures the photodiode 24 by ion implantation (impurity implantation process). This ion implantation is, for example, performed employing boron as the ion species, with the ions implanted by acceleration to about 1000 KeV (so-called P-well implantation).

The adjustment of the positions of the PN junctions of the photodiodes 22 and 24 (the interface between the bottom of the P type well 38 and the N type well 36, and the interface between the bottom of the P type well 46 and the N type well 44) is performed by these P-well implantations.

Next, drive-in is performed, to make the PN junction depth even deeper by ion implantation (drive-in process). The "drive-in" here is a process to obtain a specific impurity distribution and diffusion depth, also referred to as well diffusion, and is performed by high temperature heat treatment at about 1200° C., for a duration of several hours.

Figure 2H:
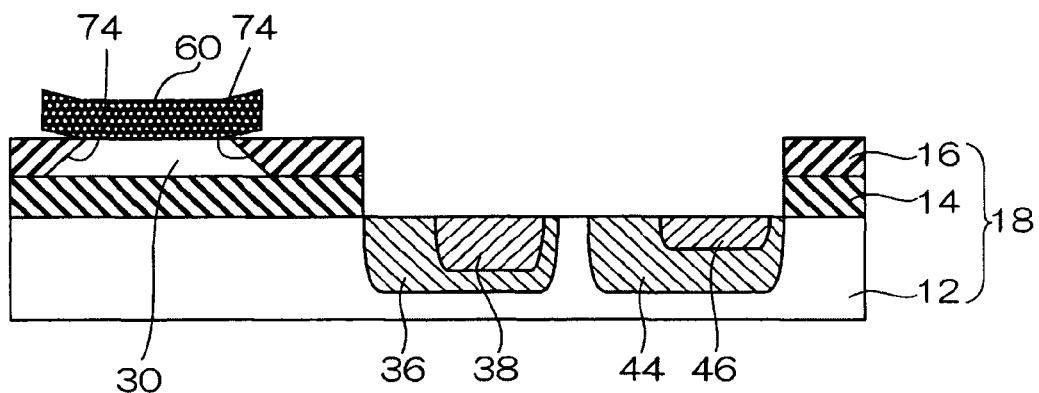
Figure 2:
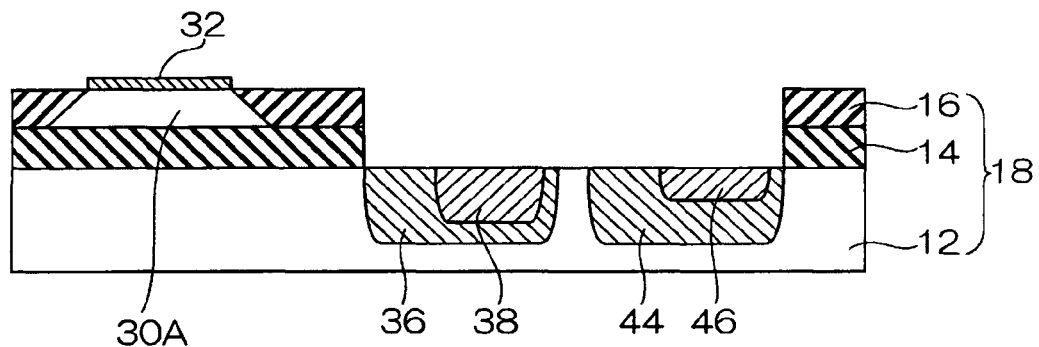

Then, as shown in FIG. 2H, using the nitride film layer 60 as a mask, ion implantation (so-called channel stop implantation) is performed to isolation ends 74 of the silicon layer 16, in order to suppress the occurrence of parasitic channel at the isolation ends 74.

Next, after removing the nitride film layer 60 in the region for forming the control circuit transistor 20, as shown in FIG. 2I, the gate oxide film 32 is formed by oxidizing the surface of the active region 30 (surface of the silicon layer 16). After the gate oxide film 32 has been formed, a photoresist (not shown in the figures) is formed on the semiconductor substrate 18 in areas other than the region of the gate oxide film 32, and ion implantation for threshold value correction is performed, making the active region 30 into a P− type impurity diffusion layer 30A.

Figure 2J:
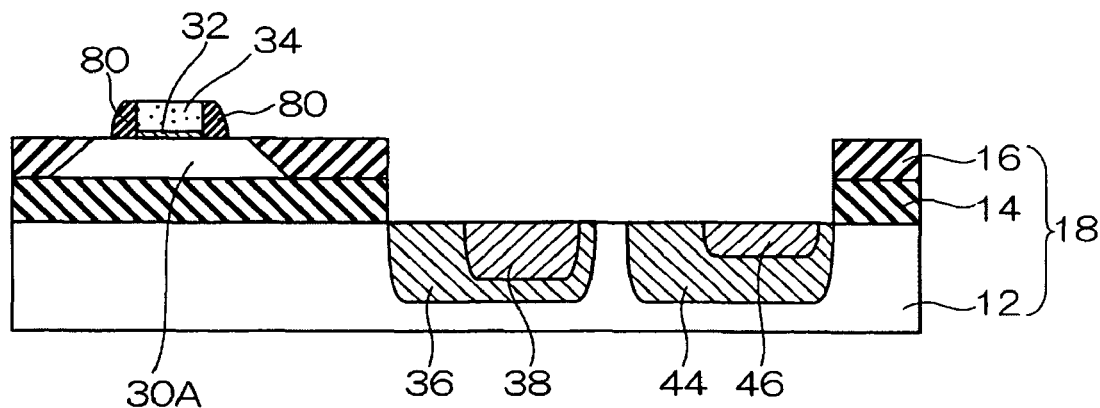
Figure 2K:
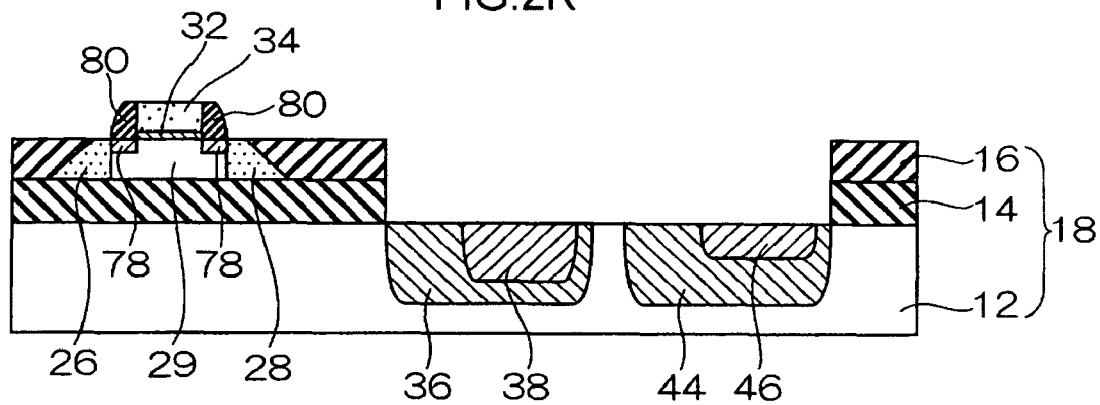

Next, as shown in FIG. 2J, the gate electrode 34 is formed on the gate oxide film 32 and ion implantation is performed to the P− type impurity diffusion layer 30A, forming a side-well spacer 80 at both side faces of the gate electrode 34, in order to to from Lightly Doped Drain (LDD) regions 78 (see FIG. 2K). Then, a mask oxide film layer (not shown in the figures) of a film thickness of about 10 nm is formed to the entire surface of the semiconductor substrate 18 (that is the entire surface of the region for forming the control circuit transistor 20 and the regions for forming the photodiodes 22 and 24) using, for example, a CVD method.

Then, N+ type impurity diffusion layers of high concentration are formed to the P− type impurity diffusion layer 30A by ion implantation, at portions at both ends of the P− type impurity diffusion layer 30A, as shown in FIG. 2K. One of these two N+ type impurity diffusion layers is the source region 26, and the other is the drain region 28 (amplifying element forming process). The region disposed between the source region 26 and the drain region 28 is the channel region 29.

Figure 2L:
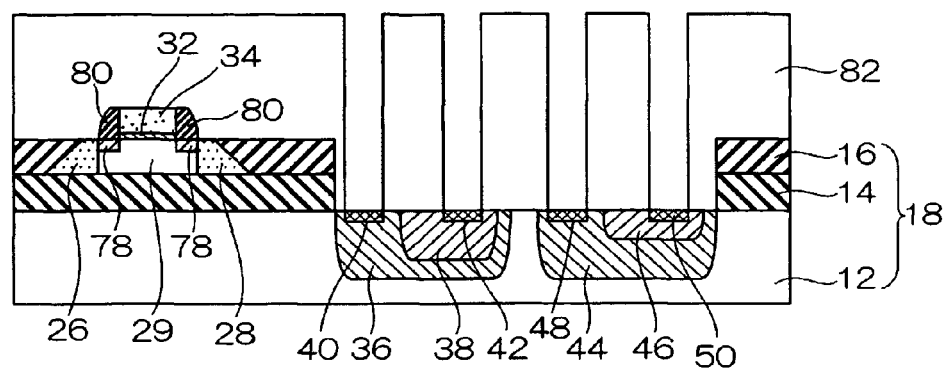

Next, as shown in FIG. 2L, a photoresist 82 is formed on the semiconductor substrate 18, the photoresist 82 being formed with an opening pattern exposing a portion of the N type well 36 and a central portion of the P type well 38, which configure the photodiode 22, and with an opening pattern exposing a portion of the N type well 36 and a central portion of the P type well 46, which configure the photodiode 24.

Using the photoresist 82 as a mask, the N+ type impurity diffusion layer 40 of high concentration for employing as an extraction electrode and the P+ type impurity diffusion layer 42 are formed, respectively, by ion implantation to the N type well 36 and the surface layer at a central portion of the P type well 38, which configure the photodiode 22. Similarly, the N+ type impurity diffusion layer 48 of high concentration for employing as an extraction electrode and the P+ type impurity diffusion layer 50 are formed, respectively, by ion implantation to the N type well 44 and the surface layer of a central portion of the P type well 46, which configure the photodiode 24 (so-called contact implantation). Then, after the photoresist 82 has been removed, the source region 26 and the drain region 28, and each of the N+ type impurity diffusion layers and each of the P+type impurity diffusion layers of portions of the photodiodes 22 and 24, are activated by performing high temperature, short duration, heat treatment (for example at 1000° C., for about 10 seconds).

Figure 2M:
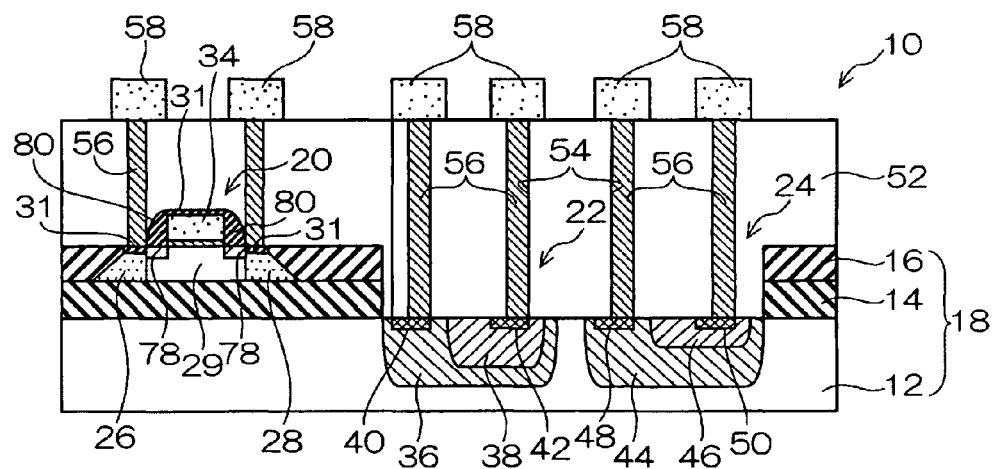

Next, a portion of the photoresist 82 is removed, and, as shown in FIG. 2M, after forming the silicide layer 31 to the top faces of the gate electrode 34, the surface of the source region 26, and the surface of the drain region 28 for configuring the control circuit transistor 20, the interlayer insulation film 52 is formed over the entire surface of the semiconductor substrate 18.

Then, the control circuit transistor 20 (the gate electrode 34, the source region 26 and the drain region 28 thereof), the photodiode 22 (the N+type impurity diffusion layer 40 and the P+ type impurity diffusion layer 42 thereof), and the photodiode 24 (the N+ type impurity diffusion layer 48 and the P+ type impurity diffusion layer 50 thereof), which are formed to the semiconductor substrate 18, are each formed with respective contact holes 54 in order to make contact therewith, and conductive contact plugs 56 of a metal (for example tungsten or the like) are filled into the contact holes 54. Next, the wiring line 58 is formed on the surface of the interlayer insulation film 52 so as to electrically connect to the conductive contact plugs 56.

The semiconductor device 10 is fabricated as described above.

Application of the Method of Fabricating the Semiconductor Device

Generally, during fabrication of the semiconductor device 10, high precision masks are employed when forming the control circuit transistor 20, in order to position the control circuit transistor 20 on the semiconductor substrate 18, with placement of the active region 30 in particular being extremely important.

When fabricating the semiconductor device 10, there is a drive-in process (well diffusion) performed in order to obtain a specific impurity distribution and diffusion depth. However, since this drive-in process is high temperature, long duration, heat treatment (about 1200° C. for about 12 hours), were the control circuit transistor 20 to be formed prior to the drive-in process, the control circuit transistor 20 would be affected by the heat of the drive-in process. Therefore, when drive-in process are performed, the control circuit transistor 20 is formed after the N type wells 36 and 44 and the P type wells 38 and 46 have been formed.

In such cases, a positioning mark (not shown in the figures) is formed in advance on the semiconductor substrate 18, and forming of the N type wells 36 and 44, the P type wells 38 and 46, and the like, is performed with reference to the positioning mark. Hence, a process for forming the positioning mark is required.

However, in the present exemplary embodiment, as shown in FIG. 2B, the active region 30 of the control circuit transistor 20 is formed on the semiconductor substrate 18, and the N type wells 36 and 44, the P type wells 38 and 46, and the like, which configure the photodiodes 22 and 24, are formed prior to forming the control circuit transistor 20. When forming the N type wells 36 and 44 and the like on the semiconductor substrate 18, the photoresist 62, 67 72, and the like are formed, as shown in FIG. 2C to FIG. 2F, however, these are formed on the semiconductor substrate 18 with the active region 30 acting as a reference for positioning.

Consequently, the N type wells 36 and 44, the P type wells 38 and 46, and the like, are formed with high precision on the semiconductor substrate 18. Furthermore, there is no requirement to form a positioning mark on the semiconductor substrate 18 in advance, so the number of processes can be reduced, and the semiconductor device 10 can be fabricated at lower cost.

In FIG. 2H, a drive-in process is performed after forming the N type wells 36 and 44 and the P type wells 38 and 46, then the control circuit transistor 20 is formed, as shown in FIG. 2J and FIG. 2K. Consequently, the control circuit transistor 20 is not affected by the heat of the drive-in process.

Note that while explanation of the method of fabricating the semiconductor device 10 according to the present exemplary embodiment is of an embodiment in which there are two photodiodes formed, there is no limitation thereto, and embodiments may be made with three or more photodiodes formed. Furthermore, logic circuit(s) and sensor element(s) can also be consolidated onto the semiconductor substrate.

Furthermore, while explanation in the method of fabricating the semiconductor device 10 according to the present exemplary embodiment is of an embodiment employing an SOI wafer as the semiconductor substrate 18, there is no limitation thereto, and an embodiments may be made in which a bulk wafer or an epi-wafer is employed.

Furthermore, the method of fabricating the semiconductor device according to the present exemplary embodiment explained above should not be interpreted in a limited manner, and the present invention is realizable within any scope that satisfies the requirements of the present invention.

What is claimed is:

1. A method of fabricating a semiconductor device having a plurality of light receiving elements, and having an amplifying element that amplifies an output signal from the light receiving elements, mounted on a semiconductor substrate, the method comprising:
   a) an active region forming process that forms an active region on the semiconductor substrate for configuring the amplifying element;
   b) after the active region forming process, performing a light receiving element region forming process that forms a light receiving element region on the semiconductor substrate for forming the plurality of light receiving elements, with the active region acting as a reference for positioning;
   c) after the light receiving element region forming process, performing an impurity implantation process that implants an impurity into the light receiving element region;
   d) repeating the light receiving element region forming process b) and repeating the impurity implantation process c) a number of times that equals a number of diffusion layers in the light receiving element region;
   e) after the impurity implantation process, performing a drive-in process to carry out drive in of the semiconductor substrate; and
   f) after the drive-in process, performing an amplifying element forming process that implants an impurity in the active region and forms the amplifying element;
   wherein when the number of diffusion layers is two, the impurity implanted at process c), and the impurity implanted at process d) when the process c) is repeated the second time, are impurities showing opposite conductivities to each other.

2. The method of claim 1, wherein the semiconductor substrate is an SOI substrate, with a silicon support substrate, an embedded oxide film layer, and a silicon layer, formed in this sequence.

3. The method of claim 2, wherein the active region forming process a) comprises:
   a1) a process that forms a patterned nitride film layer on the silicon layer at a region that will become the active region; and
   a2) a process that, using the nitride film layer as a mask, oxidizes the silicon layer as far as the embedded oxide film layer to form an isolation layer.

* * * * *